United States Patent [19]

Tracy et al.

[11] Patent Number: 4,612,077
[45] Date of Patent: Sep. 16, 1986

[54] ELECTRODE FOR PLASMA ETCHING SYSTEM

[75] Inventors: David H. Tracy, Norwalk, Conn.; Donald L. Smith, Palo Alto, Calif.

[73] Assignee: The Perkin-Elmer Corporation, Norwalk, Conn.

[21] Appl. No.: 759,819

[22] Filed: Jul. 29, 1985

[51] Int. Cl.[4] .................. C23F 1/02; B44C 1/22; C03C 15/00
[52] U.S. Cl. .................. 156/345; 156/643; 156/646; 156/656; 204/298
[58] Field of Search .............. 156/345, 643, 646, 656, 156/659.1; 204/164, 192 E, 298; 427/38, 39; 118/715, 732, 50.1, 620; 219/121 PU

[56] References Cited

U.S. PATENT DOCUMENTS 4,277,304 7/1981 Horiike et al. .................. 156/345 X
4,340,462 7/1982 Koch .................. 156/345 X
4,534,816 8/1985 Chen et al. .................. 156/345

Primary Examiner—William A. Powell
Attorney, Agent, or Firm—Thomas P. Murphy; Edwin T. Grimes; Francis L. Masselle

[57] ABSTRACT

An electrode includes a plurality of nested concentric rings forming plenum chambers. Process gas is fed into the plenum chambers through capillary tubes. The gas is then delivered through slits between the rings into a plasma etching reactor.

7 Claims, 3 Drawing Figures

ELECTRODE FOR PLASMA ETCHING SYSTEM

BACKGROUND OF THE INVENTION

Porous electrodes and so-called showerhead counter electrodes have been used for plasma etching semiconductor wafers. Such systems have included a reactor chamber including a pair of electrodes across which a source of power is applied. A silicon wafer, which may have a metal film thereon to be etched is generally placed on one of the electrodes. The gas for producing the plasma gas within the reactor is generally introduced into the reactor through the porous or showerhead electrode.

While porous electrodes are satisfactory in many cases, they present some problems in others. One of the problems with porous plate electrodes is there is a limited range of materials which can be fabricated in porous forms and not every material is available in porous forms. The range of pore sizes is sometimes limited for given materials. Therefore the gas conductance through the porous electrode may be limited. In some processes, the pores in the electrode are easily clogged up.

The surface area of exposed surface material is very large in a porous plate. Therefore, any chemical reaction which may occur between the electrode material and the etching gases could lead to corrosion or other effects.

A showerhead electrode comprises an electrode having many holes drilled in a solid plate. Those kinds of electrodes generally work very well. However, in order to make them work well, it is necessary that the holes be very small, specifically under about 0.020" diameter.

If the holes are too big, discharges will form in the holes, and the edges of the holes will become eroded away and the electrode is subject to hot spots and becomes damaged. On the other hand, if the holes are made very small, two things may happen: First, it is difficult to fabricate the holes and costly techniques such as laser drilling may be required especially if the electrode is a hard material. Second, if the holes are very small, the number of holes required becomes very large to obtain sufficiently low gas velocity through the holes. The gas flow velocity depends on the total cross-sectional area of the holes. If the velocity becomes too high, print-through effects result. An etch non-uniformity pattern corresponding to the showerhead hole pattern may appear. At trans-sonic gas velocities, severe print-through effects occur.

To successfully use the showerhead, it is often necessary to increase the gap between the electrode and the wafer to dissipate any print through effect. A large gap, however, may mean that additional power is required.

Another problem that is common both to showerheads and to porous plate electrodes is that often the pressure drop across the electrodes can be relatively small, particularly for small gas flow rates. That is, the pressure behind the electrode used may be scarcely higher than the pressure in the process. Now that would not normally be a problem except that in general it is difficult to get sufficient heat transfer from the electrodes to the liquid cooled thermoplate. One of the easiest ways to achieve good heat transfer and therefore control the temperature of the electrode is to have a gas film between the electrode and the thermoplate. And the higher the pressure of that gas up to a point, the better the heat transfer.

OBJECTS OF THE INVENTION

It is an object of this invention to provide a novel electrode for plasma etching for semiconductor wafers.

It is a further object of this invention to provide an improved electrode for plasma etching in which print through on an etched wafer is minimized.

It is still a further object of this invention to provide direct control of etch uniformity on a wafer by controlling the plasma gas distribution.

It is still a further object of this invention to provide an improved plasma etching system in which deposition of the electrode material on an etched wafer due to corrosive or sputtering is minimized.

It is still a further object of this invention to provide an improved electrode for plasma etching which is relatively easy to fabricate.

It is still a further object of this invention to provide a plasma etching system having improved means for transferring heat from an electrode to a cooling plate.

BRIEF SUMMARY OF THE INVENTION

In accordance with the present invention, an electrode for plasma etching includes a center disc and a plurality of concentric rings dimensioned to fit inside each other and form slits therebetween. Plenums are also formed by the plates and lead to the slits. Capillaries transmit gas from a chamber into the plenums where it is then transferred through the slits into a reactor where the etching process takes place. A cooling plate provides part of the chamber and the relatively high pressure of the gas provides cooling of the electrode.

Other objects and advantages of the present invention will be apparent and suggest themselves to those skilled in the art, from a reading of the following specification with the accompanying drawings.

DESCRIPTION OF THE INVENTION

Figure 1:
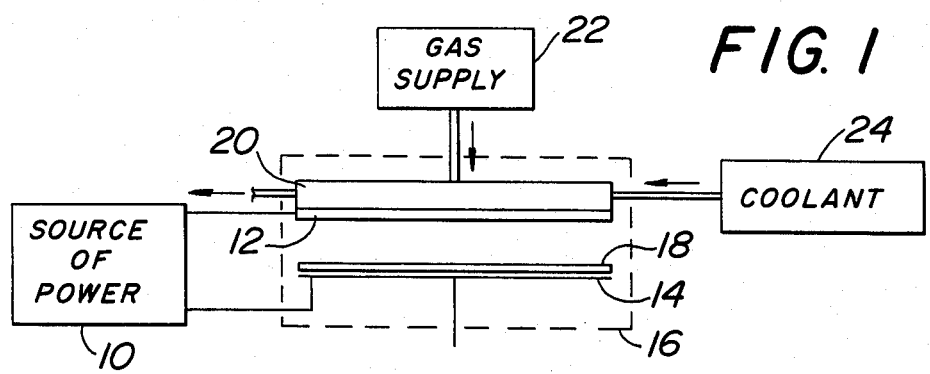
FIG. 1 illustrates generally some of the main elements in a plasma etching system in which the present invention may be used.

Referring to FIG. 1, a general plasma etching system, which may include the electrode involving the present invention, is illustrated. A source of power 10 is connected across a pair of electrodes 12 and 14 within a reactor chamber 16. A wafer 18, which may include a metallic or other coating to be etched is disposed on the electrode 14.

Figure 2:
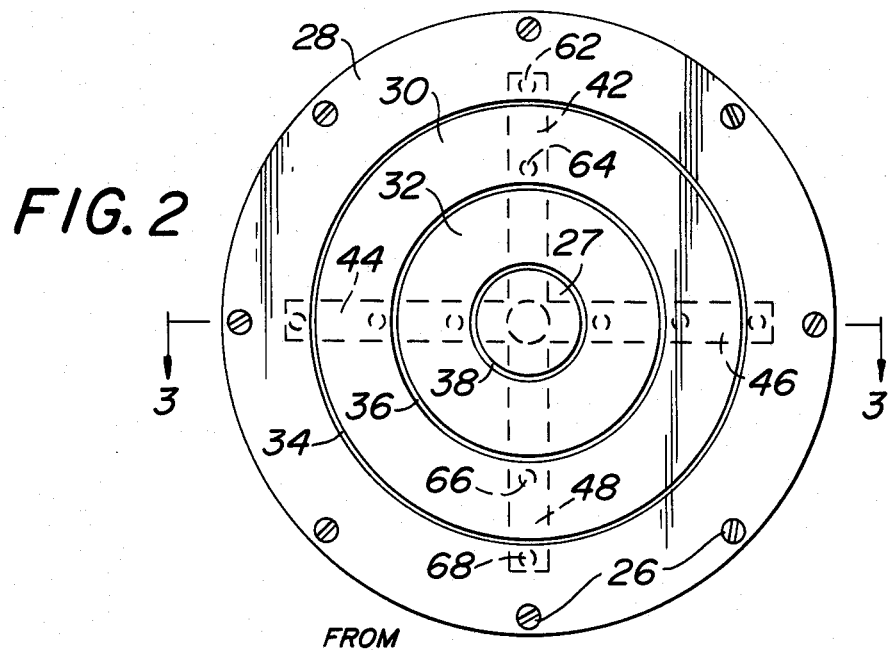
FIG. 2 is a plane view of an electrode, in accordance with the present invention.
Figure 3:
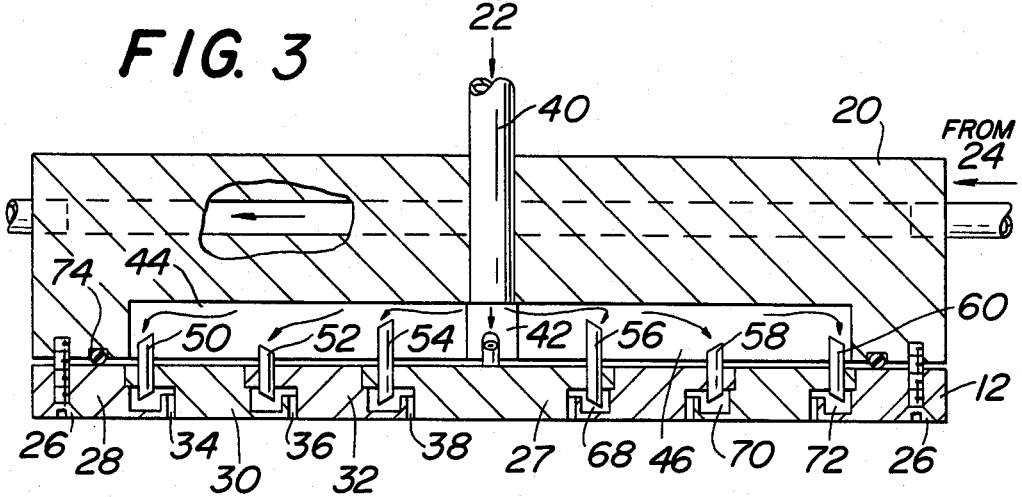
FIG. 3 is a cross-sectional view taken along lines 3—3 of FIG. 2.

The electrode 12, to be described in detail in connection with FIGS. 2 and 3, is configured to include passages leading from a souce of gas supply 22 to reactor 16. A cooling plate 20 is provided and is cooled by a source of coolant 24. This arrangement provides for cooling of the electrode 12. The electrode 12 is preferably made of magnesium which offer special advantages during operation although metals may also be used.

Among the advantages of using magnesium is its chemical resistance to chlorine based plasma chemistries. Also, it is relatively benign to semiconductors, in case some of the electrode material is sputtered onto the wafer. Magnesium is also easier to fabricate than other corrosion resistant alloys.

Referring to FIGS. 2 and 3, an outermost ring 28 of the electrode 12 is attached to the support or cooling plate 20 by screws 26. The electrode 12 comprises a center disc 27 and a set of concentric nesting rings 28, 30, 32, with the number of rings used to be determined by the number of gas entry slits.

A plurality of slit openings 34, 36 and 38 are formed by the adjacent spaced concentric rings 28, 30, 32 and the center disc 27.

Process gas from source 22 enters through a conduit 40 through a hole in the support plate 20 and flows radially outwardly into four or more slots 42, 44, 46 and 48, which are milled into the support plate 20. The pressure of the process gas in this region may be typically 25 torr for specific gas rates of about 2 sccm/cm$^2$ of wafer area. This high gas pressure provides adequate heat transfer between the electrode 12 and support plate 20 over the area of contact or near contact.

The electrode 12 comprising the concentric rings 30, 32 and a center disc 27 include openings for receiving capillary tubes 50, 52, 54, 56, 58, 60, 62, 64, 66 and 68 therein. Gas flows from the slots 42, 44, 46 and 48 (which may be considered small gas chambers), through the capillaries into circular plenums 68, 70 and 72. Gas from the plenums 68, 70, and 72 pass through slits 34, 36 and 38 into the reactor 16.

The pressure in each plenum may be 2 to 4 torr, or several times the process pressure. The mass flow of process gas into each plenum depends upon the upstream manifold pressure, the plenum pressure to a minor extent, the number of capillaries, the internal diameter of the capillaries and the lengths of the capillaries.

By adjusting the number and lengths of the capillaries leading to a particular plenum, the fraction of the total gas flow which ultimately enters the plasma reactor through the corresponding slit may be readily controlled. The cross-section of the plenums are chosen to ensure nearly uniform plenum pressure azimuthally and hence azimuthally uniform gas flow through the slits. The slit widths may be typically 0.004"–0.007" and are chosen to be narrow enough to avoid undesirable discharge effects and to maintain adequate plenum pressure while being wide enough to maintain gas exit velocities much less than sonic at the required mass flow rates. Increased numbers of annular slits also result in reduced exit velocity, and hence reduced print-through.

An O-ring seal 74 prevents leaks of process gas out the edge of the structure, between the outer electrode ring and the support plate 3.

It is seen that the present invention involving an electrode with slits has provided an alternative to porous and showerhead electrodes for plasma etching of semiconductor wafers. The particular system described provides relative freedom from print through. Also, direct control of etch uniformity is provided by controlling the gas distribution. The novel magnesium electrode described provides a minimal deposition of electrode material on the etched wafer due to corrosion or sputtering processes. The electrode described is relatively easy to fabricate and the overall system provides good heat transfer from the electrode to the cooling plate. The electrode also is easily dissassembled to permit cleaning of corrosive products.

What is claimed is:

1. An electrode for plasma etching including a source of process gas to be delivered to a reactor etching chamber comprising:
    (a) a plurality of concentric rings surrounding a center disc and disposed to rest inside each other;
    (b) said rings and said disc forming annular plenum chambers therebetween; and said rings and disc further providing a plurality of openings therein leading from said source of process gas to said plenums; and
    (c) said rings being spaced to provide annular slits therebetween for transferring gas from said plenums into said reactor etching chamber.

2. An electrode as set forth in claim 1 wherein said center disc rests on the innermost ring, includes openings therein, and forms a plenum chamber and slit opening with said innermost ring.

3. An electrode as set forth in claim 1 wherein said plurality of openings include capillary tubes therein to control the flow of gas into said plenums.

4. An electrode as set forth in claim 2 wherein the outermost ring is connected to a liquid cooled plate to form a chamber including said process gas to be delivered through said openings, said plenums and said annular slits to said reactor chamber.

5. An electrode as set forth in claim 4 wherein said electrode comprises magnesium.

6. An electrode as set forth in claim 5 wherein said chamber comprises a plurality of slots milled in said liquid cooled plate.

7. An electrode as set forth in claim 6 wherein said slots comprise four in number disposed at right angles to each other and extending across all of said capillary tubes.

* * * * *